(12) United States Patent
Ishizaka

(10) Patent No.: US 7,829,158 B2
(45) Date of Patent: Nov. 9, 2010

(54) METHOD FOR DEPOSITING A BARRIER LAYER ON A LOW DIELECTRIC CONSTANT MATERIAL

(75) Inventor: Tadahiro Ishizaka, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 616 days.

(21) Appl. No.: 11/745,384

(22) Filed: May 7, 2007

(65) Prior Publication Data

US 2007/0251445 A1 Nov. 1, 2007

(51) Int. Cl.
C23C 16/16 (2006.01)
H05H 1/24 (2006.01)
(52) U.S. Cl. .............. 427/576; 427/569; 427/255.7
(58) Field of Classification Search ............ None
See application file for complete search history.

(56) References Cited

U.S. PATENT DOCUMENTS

| 2002/0197402 | A1* | 12/2002 | Chiang et al. ......... 427/255.39 |
| 2006/0210723 | A1 | 9/2006 | Ishizaka |
| 2006/0211243 | A1 | 9/2006 | Ishizaka et al. |
| 2006/0211246 | A1 | 9/2006 | Ishizaka et al. |
| 2006/0213437 | A1 | 9/2006 | Ishizaka et al. |
| 2006/0213438 | A1 | 9/2006 | Ishizaka et al. |
| 2006/0213439 | A1 | 9/2006 | Ishizaka |
| 2007/0042577 | A1 | 2/2007 | Ishizaka |
| 2007/0054047 | A1 | 3/2007 | Ishizaka et al. |

FOREIGN PATENT DOCUMENTS

| WO | WO2006US101886 A2 | 9/2006 |
| WO | WO2006US1011619 A2 | 9/2006 |
| WO | WO2006US104741 A2 | 10/2006 |
| WO | WO2006US104863 A2 | 10/2006 |
| WO | WO2007US024341 A2 | 3/2007 |
| WO | WO2007US0302128 A2 | 3/2007 |

OTHER PUBLICATIONS

U.S. Appl. No. 11/218,471: Tadahiro Ishizaka and Atsushi Gomi, Method of Forming a Tantalum-Containing Layer from a Metalorganic Precursor.

U.S. Appl. No. 11/378,271: Tadahiro Ishizaka, Method of Plasma Enhanced Atomic Layer Deposition of TaC and TaCN Films Having Good Adhesion to Copper.

(Continued)

*Primary Examiner*—Timothy H Meeks
*Assistant Examiner*—Joseph Miller, Jr.

(57) ABSTRACT

A method of forming a tantalum containing multi-layer film. In one embodiment, the method includes disposing a substrate in a process chamber, heating the substrate, exposing the substrate to a tantalum containing precursor to adsorb at least a portion of the tantalum containing precursor on a surface of the substrate, purging the process chamber with a purge gas, and exposing the substrate to a process space comprising helium and hydrogen ionized at a first radio frequency power to form a first tantalum containing layer on the surface. The method further includes exposing the substrate to the tantalum containing precursor to adsorb at least a portion of the precursor on the first tantalum containing layer, purging the process chamber with the purge gas, and exposing the substrate to the process space at a second radio frequency power to form a second tantalum containing layer, where the second radio frequency power is different from the first radio frequency power.

5 Claims, 6 Drawing Sheets

OTHER PUBLICATIONS

U.S. Appl. No. 11/378,270: Tadahiro Ishizaka, Frank M Cerio, Jacques Faguet, Method of Light Enhanced Atomic Layer Deposition.

U.S. Appl. No. 11/393,872: Tadahiro Ishizaka, Method of Forming a Metal Carbide or Metal Carbonitride Film Having Improved Adhesion.

U.S. Appl. No. 11/691,167: Tadahiro Ishizaka, Satohiko Hoshino, Kazuhiro Hamamoto, Shigeru Mizuno, Yasushi Mizusawa, Diffusion Barrier for Integrated Circuits Formed from a Layer of Reactive Metal and Method of Fabrication.

U.S. Appl. No. 11/691,897: Tadahiro Ishizaka, Atsushi Gomi, Interconnect Structures Containing a Ruthenium Barrier Film and Method of Forming.

U.S. Appl. No. 11/378,263: Tadahiro Ishizaka, Tsukasa Matsuda, Masamichi Hara, Jacques Faguet, Yasushi Mizusawa, Method of Integrating PEALD Ta-Containing Films Into Cu Metallization.

* cited by examiner

METHOD FOR DEPOSITING A BARRIER LAYER ON A LOW DIELECTRIC CONSTANT MATERIAL

FIELD OF THE INVENTION

The field of invention relates generally to the field of semiconductor integrated circuit manufacturing and, more specifically but not exclusively, relates to methods and processing systems for forming Ta-containing films using plasma enhanced atomic layer deposition.

BACKGROUND OF THE INVENTION

Typically, during materials processing, plasma is employed to facilitate the partial or complete addition and removal of thin films. For example, in semiconductor processing, a (dry) plasma etch process is used to remove or etch material along fine trenches or within vias or contacts patterned on a silicon substrate. Alternatively, a vapor deposition process is used to deposit material along fine lines or within vias or contacts on a silicon substrate. In the latter, vapor deposition processes include thermal chemical vapor deposition (CVD) and plasma enhanced chemical vapor deposition (PECVD).

In PECVD, plasma is used to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of CVD or more generally film deposition, has emerged as a candidate for ultra-thin gate film formation in front end-of-line (FEOL) operations, as well as ultra-thin barrier layer and seed layer formation for metallization in back end-of-line (BEOL) operations. In ALD, two or more process gases are introduced alternately and sequentially to form a material film one monolayer (or less) at a time. Such an ALD process has proven to provide improved uniformity and control in layer thickness, as well as conformality to features on which the layer is deposited.

The introduction of copper (Cu) metal into multilayer metallization schemes for manufacturing integrated circuits has necessitated the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. For example, Cu integration schemes for technology nodes less than or equal to 130 nm can utilize a low dielectric constant (low-k) inter-level dielectric, followed by a physical vapor deposition (PVD) of a Ta film or a TaN/Ta film, followed by a PVD Cu seed layer, and an electro-chemical deposition (ECD) Cu fill. Generally, Ta-containing films are chosen for their adhesion properties (i.e., their ability to adhere on low-k films) and their barrier properties (i.e., their ability to prevent Cu diffusion into the low-k film).

The deposition of a Ta-containing film using PVD can be problematic for structures with high aspect ratios, the ratio of height-to-width of a trench for example, where the PVD deposition of the Ta-containing film is non-uniform along the side walls and bottom of the trench. In one example, a thick film layer may be formed on the bottom of the trench while the film layer on the sidewalls of the trench may be very thin or even non-existent.

BRIEF DESCRIPTION OF THE DRAWINGS

The present invention is illustrated by way of example and not as a limitation in the accompanying figures.

DETAILED DESCRIPTION

There is a general need for forming very thin layer barrier on materials, such as low-K dielectrics, without damaging the underlying dielectric or surface. One way to form barrier layer films on planes, structures or material overlying complex geometry, such as high aspect vias, is to form barrier layers using a plasma enhanced atomic layer deposition (PEALD) system. By using a PEALD system, a very thin and consistent layer or plurality of layers may be produced resulting in a barrier film that conforms to the existing surface topography while minimizing or avoiding damage to an underlying surface. The underlying surface, which may be a carbon doped silicon oxide (SiCOH) low-K dielectric layer, may be capped with one or more barrier layers to minimize or eliminate diffusion of contaminants that may degrade or destroy a functionality of the dielectric layer. A properly configured PEALD system may be used to protect an underlying layer or surface by applying a very accurately controlled thickness of barrier material to prevent contaminants from diffusing or propagating to the underlying material.

Figure 1:
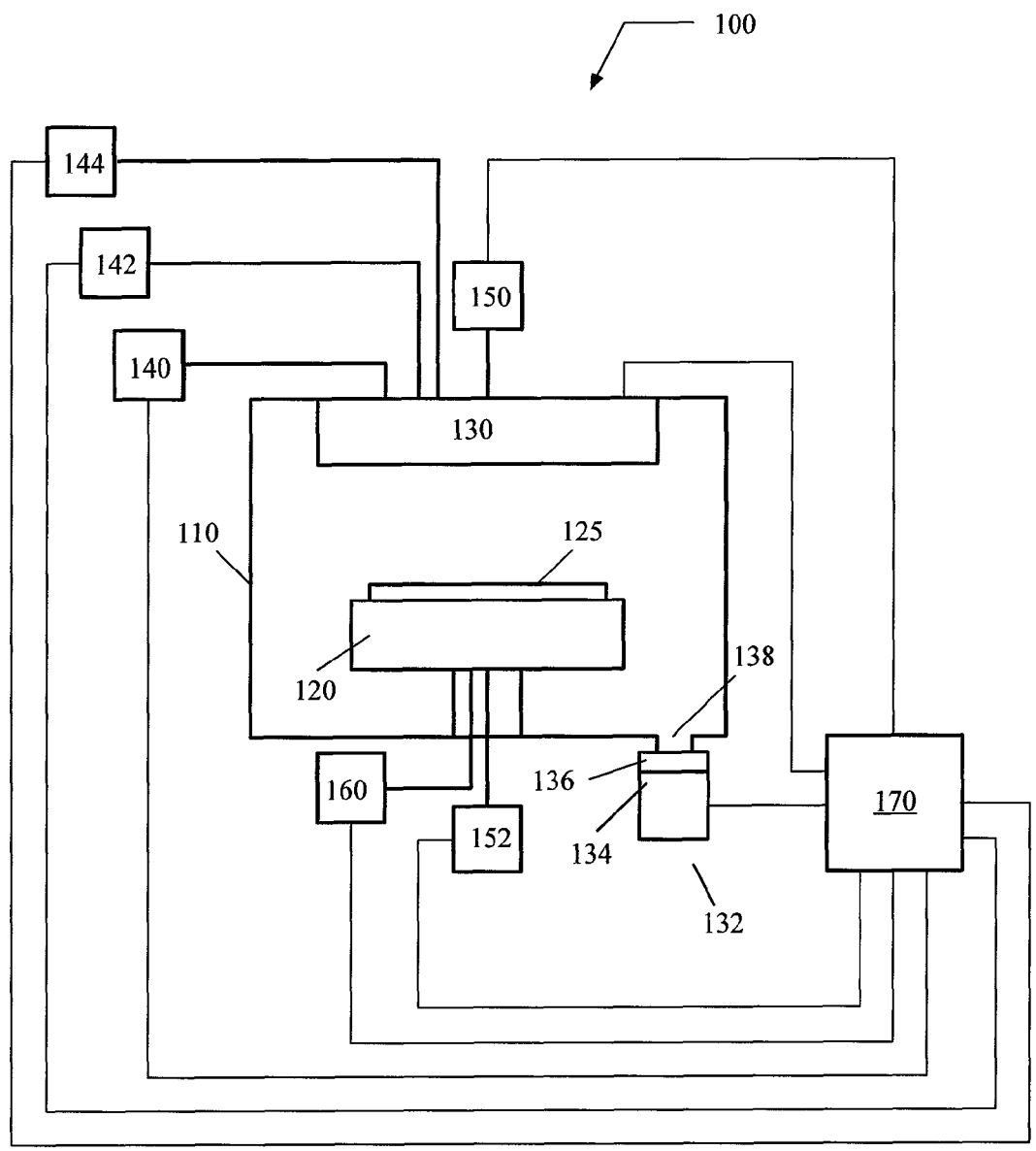
FIG. 1 depicts a schematic view of a PEALD system in accordance with an embodiment of the invention.

Referring now to the figures, FIG. 1 illustrates a PEALD system 100 for depositing one or more thin tantalum (Ta), tantalum nitride (TaN), tantalum carbon nitride (TaCN), carbon-rich TaC'N and nitrogen-rich TaCN' layers on a substrate, according to an embodiment of the invention. A carbon-rich TaC'N layer is a tantalum containing layer with a high carbon (C) to tantalum (Ta) ratio. Similarly, a nitrogen-rich TaCN' layer is a Ta containing layer with a high nitrogen (N) to Ta ratio. In one example, during the metallization of inter-connect and intra-connect structures for semiconductor devices in back-end-of-line (BEOL) operations, a thin conformal Ta, TaN, TaCN, carbon-rich TaC'N and nitrogen-rich TaCN' barrier layer may be deposited on wiring trenches or vias to minimize the migration of metal into the inter-level or intra-level dielectric, where the barrier layer provides acceptable adhesion to the dielectric and a seed layer, formed of a seed material known to one skilled in the art, such as ruthenium (Ru) or copper (Cu), that is subsequently deposited on the barrier layer for subsequent metallization.

The PEALD system 100 comprises a process chamber 110 having a substrate holder 120 configured to support a substrate 125, upon which a thin Ta-containing layer is formed. The process chamber 110 further comprises an upper assembly 130 coupled to a first vapor distribution system 140, a second vapor distribution system 142, and a gas supply system 144. The gas supply system 144 may be a manifold configured to deliver one or more gases including a purge gas and a reacting agent such as hydrogen. Additionally, the PEALD system 100 includes a first power source 150 coupled to the process chamber 100 and configured to generate plasma in the process chamber 100, and a substrate temperature control system 160 coupled to substrate holder 120 and configured to elevate and control the temperature of substrate 125. Additionally, the PEALD system 100 includes a controller 170 that can be coupled to process chamber 110, substrate holder 120, upper assembly 130, first vapor distribution system 140, second vapor distribution system 142, gas supply system 144, first power source 150, and substrate temperature control system 160. Alternatively, or in addition, controller 170 can be coupled to one or more additional controllers/computers (not shown), and controller 170 can obtain setup and/or configuration information from an additional controller/computer.

In FIG. 1, singular processing elements (110, 120, 130, 140, 142, 144, 150, and 160) are shown, but this is not required for the invention. The PEALD system 100 can include any number of processing elements having any number of controllers associated with them in addition to independent processing elements.

The controller 170 can be used to configure any number of processing elements (110, 120, 130, 140, 142, 144, 150, and 160), and the controller 170 can collect, provide, process, store, and display data from processing elements. The controller 170 can comprise a number of applications for controlling one or more of the processing elements. For example, controller 170 can include a graphic user interface (GUI) component (not shown) that can provide easy to use interfaces that enable a user to monitor and/or control one or more processing elements.

Still referring to FIG. 1, the PEALD system 100 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in context with the processing of a semiconductor substrate, the invention is not limited solely thereto.

The first vapor distribution system 140 and the second vapor distribution system 142 are configured to introduce a first process material to process chamber 110 and a second process material to process chamber 110. The process materials can, for example, comprise a Ta film precursor, such as a composition having the principal atomic or molecular species found in the tantalum (Ta), tantalum nitride (TaN), tantalum carbon nitride (TaCN), carbon-rich TaCN and nitrogen-rich TaCN layer formed on substrate 125. For instance, the Ta film precursor may originate as a solid phase, a liquid phase, or a gaseous phase, and it may be delivered to process chamber 110 in a gaseous phase with or without the use of a carrier gas.

Additionally, the gas supply system 144 can be configured to introduce a purge gas and/or a reacting agent to process chamber 110. For example, the introduction of purge gas may occur between introduction of the first process material and the second process material to process chamber 110, or following the introduction of the second process material to process chamber 110, respectively. The purge gas can comprise an inert gas, such as a noble gas (i.e., helium, neon, argon, xenon, krypton), or nitrogen ($N_2$), or hydrogen ($H_2$).

Referring still to FIG. 1, the PEALD system 100 includes a plasma generation system configured to generate a plasma in process chamber 110. The plasma generation system can include a first power source 150 coupled to the process chamber 110, and configured to couple power to the process material process chamber 110. The first power source 150 may be a variable power source and may include a radio frequency (RF) generator and an impedance match network, and may further include an electrode through which RF power is coupled to the plasma in process chamber 110. The electrode may be formed in the upper assembly 130, and it may be configured to oppose the substrate holder 120. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 110 by reducing the reflected power. Match network topologies (e.g. L-type, p-type, T-type, etc.) and automatic control methods are well known to those skilled in the art.

Alternatively, the first power source 150 may include a RF generator and an impedance match network, and may further include an antenna, such as an inductive coil, through which RF power is coupled to plasma in process chamber 110. The antenna can, for example, include a helical or solenoid coil, such as in an inductively coupled plasma source or helicon source, or it can, for example, include a flat coil as in a transformer coupled plasma source.

Alternatively, the first power source 150 may include a microwave frequency generator, and may further include a microwave antenna and microwave window through which microwave power is coupled to plasma in process chamber 110. The coupling of microwave power can be accomplished using electron cyclotron resonance (ECR) technology, or it may be employed using surface wave plasma technology, such as a slotted plane antenna (SPA).

According to one embodiment of the invention, the PEALD system 100 includes a substrate bias generation system configured to generate or assist in generating a plasma (through substrate holder biasing) during at least a portion of the alternating introduction of the first process material and the second process material to process chamber 110. The substrate bias system may include a substrate power source 152 coupled to the process chamber 110, and configured to couple power to the substrate holder 120. The substrate power source 152 may include a RF generator and an impedance match network, and may further include an electrode through which RF power is coupled to substrate holder 120. The electrode may be formed in substrate holder 120. For instance, the substrate holder 120 may be electrically biased at a RF voltage via the transmission of RF power from a RF generator (not shown) through an impedance match network (not shown) to substrate holder 120. A typical frequency for the RF bias may range from about 0.1 MHz to about 100 MHz. In one embodiment, the RF bias frequency is approximately 13.56 MHz. RF bias systems for plasma processing are well known to those skilled in the art. Alternatively, RF power is applied to the substrate holder electrode at multiple frequencies.

Although the plasma generation system and the substrate bias system are illustrated in FIG. 1 as separate entities, they may indeed comprise one or more power sources coupled to substrate holder 120.

Still referring to FIG. 1, PEALD system 100 includes a substrate temperature control system 160 coupled to the substrate holder 120 and configured to elevate, monitor, and control the temperature of substrate 125. Substrate temperature control system 160 comprises temperature control elements, such as a cooling system including a re-circulating coolant flow that receives heat from substrate holder 120 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 120, as well as the chamber wall of the processing chamber 110 and any other component within the PEALD system 100.

In order to improve the thermal transfer between substrate 125 and substrate holder 120, substrate holder 120 may include a mechanical clamping system, or an electrical clamping system, such as an electrostatic clamping system, to affix substrate 125 to an upper surface of substrate holder 120. Furthermore, substrate holder 120 can further include a substrate backside gas delivery system configured to introduce gas to the back-side of substrate 125 to improve a gas-gap thermal conductance between substrate 125 and substrate holder 120. Such a system can be used when temperature control of the substrate is required at elevated or reduced temperatures. For example, the substrate backside gas system may comprise a two-zone gas distribution system, wherein the helium gas gap pressure can be independently varied between the center and the edge of substrate 125.

Furthermore, the process chamber 110 is further coupled to a pressure control system 132, including a vacuum pumping system 134 and a valve 136, through a duct 138, wherein the pressure control system 132 is configured to controllably evacuate the process chamber 110 to a pressure suitable for forming the thin film on substrate 125, and suitable for use of the first and second process materials. The vacuum pumping system 134 may comprise a turbo-molecular vacuum pump (TMP) or a cryogenic pump capable of a pumping speed up to about 5000 liters per second (and greater) and valve 136 may be a gate valve for throttling the chamber pressure. In conventional plasma processing devices utilized for dry plasma etch, a 300 to 5000 liter per second TMP is generally employed. Moreover, one or more devices for monitoring chamber pressure (not shown) can be coupled to the processing chamber 110. A pressure measuring device may be, for example, a Type 628B Baratron absolute capacitance manometer commercially available from MKS Instruments, Inc. (Andover, Mass.).

Still referring to FIG. 1, controller 170 may comprise a microprocessor, memory, and a digital I/O port capable of generating control voltages sufficient to communicate and activate inputs to the PEALD system 100 as well as monitor outputs from the PEALD system 100. Moreover, the controller 170 may be coupled to and may exchange information with the process chamber 110, substrate holder 120, upper assembly 130, first vapor distribution system 140, second vapor distribution system 142, gas supply system 144, first power source 150, second power source 152, substrate temperature controller 160, and pressure control system 132. For example, a program stored in the memory may be used to activate the inputs to the aforementioned components of the deposition system 100 according to a process recipe in order to perform a deposition process.

However, the controller 170 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk, an optical disk, a flash drive, or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 170 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read and optionally write.

Stored on any one or on a combination of computer readable media, resides software for controlling the controller 170, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 170 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 170.

The controller 170 may be locally located relative to the PEALD system 100, or it may be remotely located relative to the PEALD system 100. For example, the controller 170 may exchange data with the PEALD system 100 using at least one of a direct connection, an intranet, the Internet and a wireless connection. The controller 170 may be coupled to an intranet at, for example, a customer site (i.e., a device maker, etc.), or it may be coupled to an intranet at, for example, a vendor site (i.e., an equipment manufacturer). Additionally, for example, the controller 170 may be coupled to the Internet. Furthermore, another computer (i.e., controller, server, etc.) may access, for example, the controller 170 to exchange data via at least one of a wired and/or unwired connection, an intranet, and the Internet.

Figure 2:
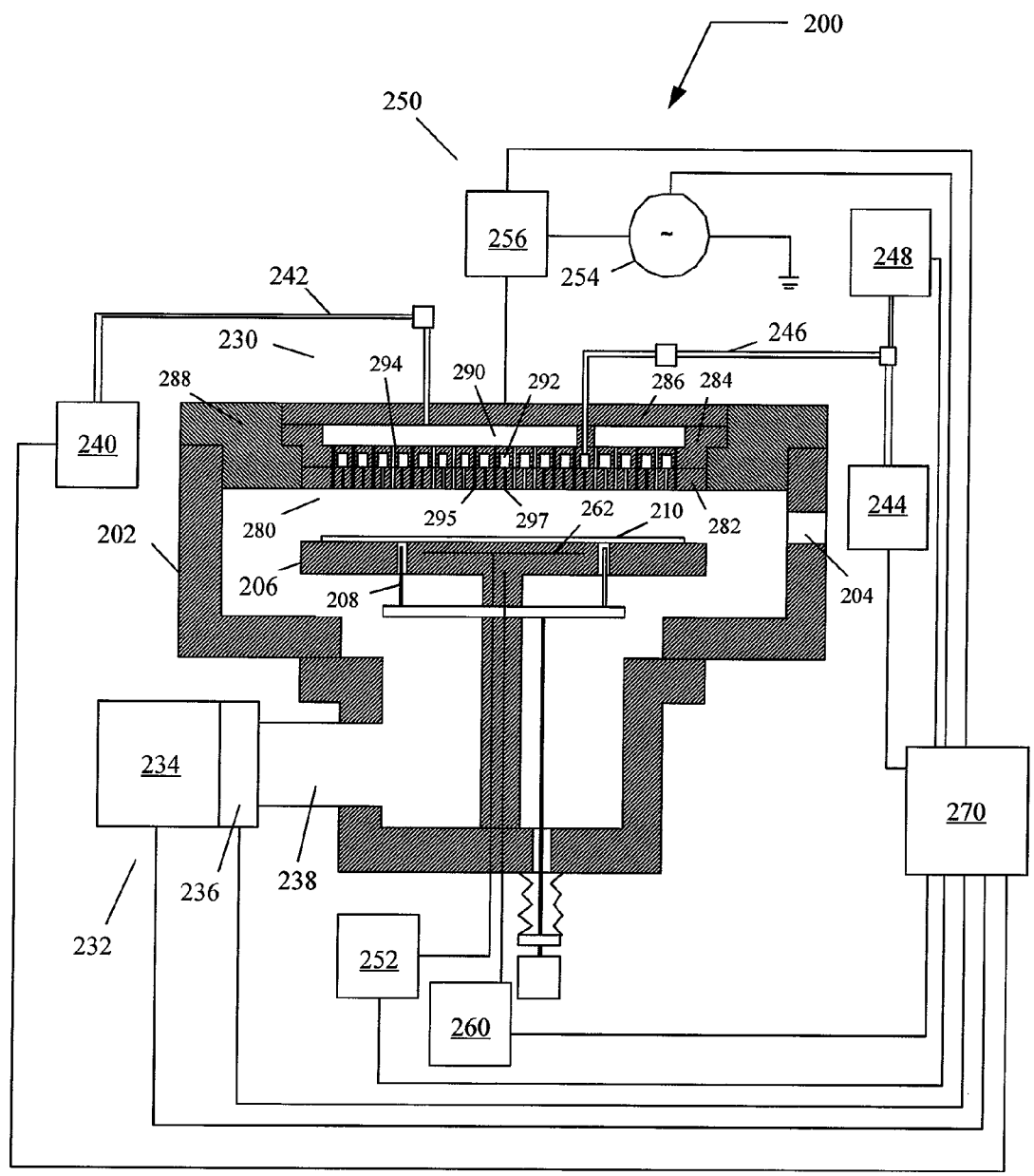
FIG. 2 depicts a schematic view of another PEALD system in accordance with an embodiment of the invention.

Referring now to FIG. 2, another embodiment of a PEALD system 200 is depicted. The PEALD system 200 comprises a process chamber 202 having a substrate holder 206 configured to support a substrate 210, upon which a barrier layer is formed. The process chamber 202 further comprises an upper assembly 230 coupled to a first vapor distribution system 240, a second vapor distribution system 244, and a gas supply system 248. The gas supply system 248 may be a manifold configured to deliver one or more gases including a purge gas and a reacting agent. According to an embodiment of the invention, the reacting agent may comprise hydrogen ($H_2$) gas, ammonia ($NH_3$), $N_2H_4$, $NH(CH_3)_2$, $N_2H_3CH_3$, silane ($SiH_4$), or disilane ($Si_2H_6$), or a combination of more than one thereof.

Additionally, the PEALD system 200 comprises a first power source 250 coupled to the process chamber 202 and configured to generate plasma in the process chamber 202, and a substrate temperature control system 260 coupled to substrate holder 206 and configured to elevate and control the temperature of substrate 210. Additionally, PEALD system 200 comprises a controller 270 that is coupled to process chamber 202, substrate holder 206, upper assembly 230, first vapor distribution system 240, second vapor distribution system 242, gas supply system 248, first power source 250, and substrate temperature control system 260. The controller 270 may be implemented, for example, as the controller 270 described with respect to FIG. 1 above.

The PEALD system 200 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates are introduced to process chamber 202 through passage 204, and they may be lifted to and from an upper surface of substrate holder 206 via substrate lift system 208.

The first process material system 240 and the second process material system 244 are configured to introduce a first process material to process chamber 202 and a second process material to process chamber 202. The process material can, for example, comprise a Ta film precursor, such as a composition having the principal atomic or molecular species found in the film formed on substrate 210. For instance, the film precursor may originate as a solid phase, a liquid phase, or a gaseous phase, and it may be delivered to process chamber 202 in a gaseous phase, and with or without a carrier gas.

According to one embodiment of the invention, the first process material and the second process material are chosen in accordance with the elemental composition and characteristics of the barrier layer to be deposited on the substrate. The first process material and the second process material may include a Ta-containing precursor containing a "Ta—N—C" structural unit, such as tertiary amyl imido-tris-dimethylamido tantalum ($Ta(NC(CH_3)_2C_2H_5)(N(CH_3)_2)_3$, hereinafter referred to as Taimata®, provided by Kojundo Kagaku of Japan. In another example, the process material can include (pentakis(diethylamido) tantalum ($Ta[N(C_2H_5)_2]_5$, PDEAT), pentakis(ethylmethylamido) tantalum ($Ta[N(C_2H_5CH_3)]_5$, PEMAT), pentakis(mehylamido) tantalum ($Ta[N(CH_3)_2]_5$, PDMAT), (t-butylimino tris(diethylamino) tantalum ($Ta(NC(CH_3)_3)(N(C_2H_5)_2)_3$, TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or tert-butyl-tris-ethylmethylamido tantalum ($(CH_3)_3CNTa(NC_2H_5(CH_3))_3$, TBTEMAT).

According to another embodiment of the invention, the process material process material is chosen in accordance with the elemental composition and characteristics of the barrier layer to be deposited. The process material can include a Ta film precursor containing a "Ta—C" structural unit, such as $Ta(n^5-C_5H_5)_2H_3$, $Ta(CH_2)(CH_3)(n^5-C_5H_5)_2$, $Ta(n^3-C_3H_5)(n^5-C_5H_5)_2$, $Ta(CH_3)_3(n^5-C_5H_5)_2$, $Ta(CH_3)_4(n^5-C_5(CH_3)_5)$, or $Ta(n^5-C_5(CH_3)_5)_2H_3$.

Additionally, the gas supply system 248 may be configured to introduce a purge gas to process chamber 202. For example, the introduction of purge gas may occur between introduction of the first process material and the second process material to process chamber 202, or following the introduction of the second process material to process chamber 202, respectively. The purge gas may comprise an inert gas, such as a noble gas (i.e., helium, neon, argon, xenon, krypton), and a dimer such as nitrogen ($N_2$), and hydrogen ($H_2$).

The first process material system 240, the second process material system 244, and the gas supply system 248 may include one or more material sources, one or more pressure control devices, one or more flow control devices, one or more filters, one or more valves, or one or more flow sensors. As discussed with respect to FIG. 1, the flow control devices can include pneumatic driven valves, electro-mechanical (solenoid) valves, and/or high-rate pulsed gas injection valves.

Referring still to FIG. 2, the first process material is coupled to process chamber 202 through first material line 242, and the second process material is coupled to process chamber 202 through second material line 246. Additionally, the purge gas may be coupled to process chamber 202 through the first material line 241, the second material line 246, or an independent line, or any combination thereof. In the embodiment of FIG. 2, the first process material, second process material, and purge gas are introduced and distributed within process chamber 202 through the upper assembly 230 that includes gas injection assembly 280. While not shown in FIG. 2, a sidewall gas injection valve may also be included in the processing system. The gas injection assembly 280 may comprise a first injection plate 282, a second injection plate 284, and a third injection plate 286, which are electrically insulated from process chamber 202 by insulation assembly 288. The first process material is coupled from the first process material supply system 240 to process chamber 202 through a first array of through-holes 294 in the second injection plate 284 and a first array of orifices 295 in the first injection plate 282 via a first plenum 290 formed between the second injection plate 284 and the third injection plate 286. The second process material, or purge gas, or both is coupled from the second vapor distribution system 244 or gas supply system 248 to process chamber 202 through a second array of orifices 297 in the first injection plate 282 via a second plenum 292 formed in the second injection plate 284.

Referring still to FIG. 2, the PEALD system 200 comprises a plasma generation system. The plasma generation system comprises a first power source 250 coupled to the process chamber 202, and configured to couple power to the first process material, or the second process material, or both in process chamber 202. The first power source 250 may be variable and includes a RF generator 254 and an impedance match network 256, and further includes an electrode, such as gas injection assembly 280, through which RF power is coupled to plasma in process chamber 202. The electrode is formed in the upper assembly 230 and is insulated from process chamber 202 via insulation assembly 288, and it can be configured to oppose the substrate holder 206. The RF frequency may, for example, range from approximately 100 kHz to approximately 100 MHz. Alternatively, the RF frequency may, for example, range from approximately 400 kHz to approximately 60 MHz. By way of further example, the RF frequency may, for example, be approximately 27.12 MHz or 13.56 MHz.

According to one embodiment of the invention, the PEALD system 200 includes a substrate bias generation system configured to generate or assist in generating a plasma (through substrate holder biasing) during at least a portion of the alternating introduction of the first process material and the second process material to process chamber 202. The substrate bias system includes a substrate power source 252 coupled to the process chamber 202, and configured to couple power to substrate holder 206. The substrate power source 252 may include a RF generator and an impedance match network, and may further include an electrode 262 through which RF power is coupled to substrate holder 206. The electrode 262 may be incorporated in the substrate holder 206. For example, substrate holder 206 may be electrically biased at a RF voltage via the transmission of RF power from a RF generator (not shown) through an impedance match network (not shown) to substrate holder 206. Alternatively, RF power is applied to the substrate holder electrode at multiple frequencies.

Still referring to FIG. 2, PEALD system 200 includes substrate temperature control system 260 coupled to the substrate holder 206 and configured to elevate and control the temperature of substrate 210. Substrate temperature control system 260 comprises at least one temperature control element, including a resistive heating element such as an aluminum nitride heater. The substrate temperature control system 260 can, for example, be configured to elevate and control the substrate temperature from room temperature to approximately 350° C. to 400° C. Alternatively, the substrate temperature can, for example, range from approximately 150° C. to 250° C. when a precursor is adsorbed on the substrate. If the substrate temperature is too high, CVD growth may be observed instead of PEALD growth. In the example of Taimata®, a substrate temperature equal to or below about 240° C. may be selected to achieve PEALD growth.

Furthermore, the process chamber 202 is further coupled to a pressure control system 232, including a vacuum pumping system 234 and a valve 236, through a duct 238, and the pressure control system 232 is configured to controllably evacuate the process chamber 202 to a pressure suitable for forming a layer on substrate 210, and suitable for use of the first and second process materials.

Figure 3:
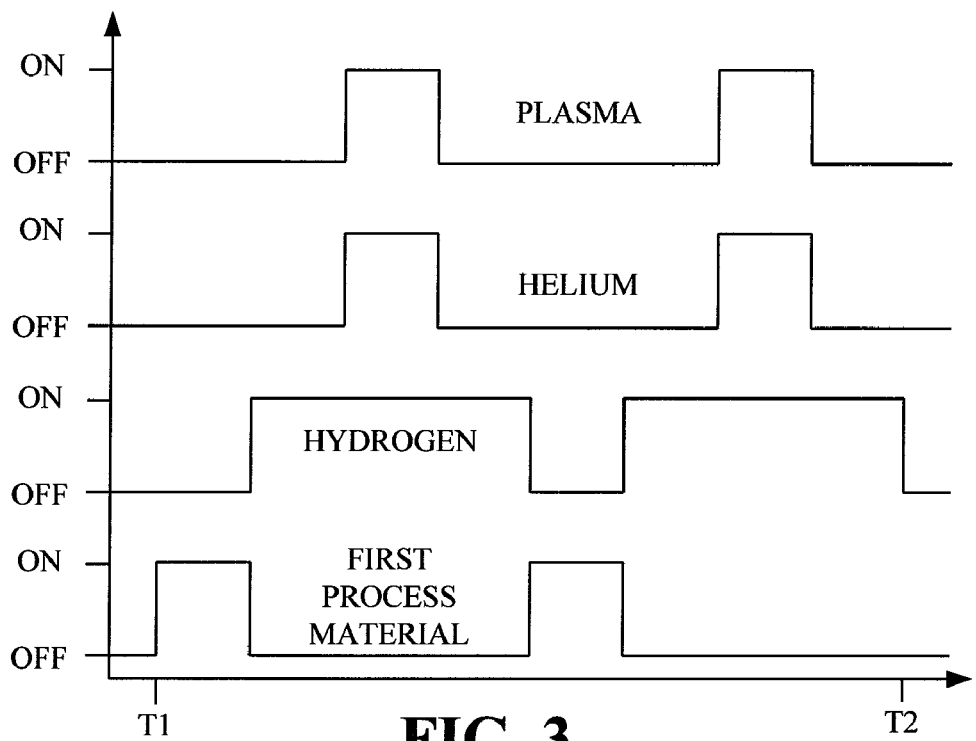
FIG. 3 is an event diagram for an PEALD process for forming a Ta-containing film in accordance with an embodiment of the invention.

FIG. 3 is an event diagram for a PEALD process for forming a Ta-containing film in accordance with an embodiment of the invention. The event diagram in FIG. 3 is intended to describe a sequence of events that may occur during the formation of a Ta containing layer. The event diagram is not intended to describe an entire process recipe comprising flow rates, pressures, temperatures, process times, radio frequency power, or other process parameters. In this embodiment, a first process material is introduced to the process chamber 202 through a first injection plate 282 to expose the substrate 210 to a Ta-containing precursor to adsorb at least a portion of the precursor on a surface of the substrate. The first process material may be a Ta-containing precursor, such as those described in FIG. 2, to be adsorbed on the surface of the substrate. In one embodiment, the temperature of the substrate is approximately between 150 Celsius (C) and 250 C. In another embodiment, the temperature of the substrate while the first process material is deposited is approximately between 170 C and 190 C.

In this embodiment, hydrogen ($H_2$) gas is introduced through the first injection plate 282 following the adsorption of the first process material. The introduction of $H_2$ in this embodiment may be used to purge the process chamber 202 of the first process material, thereby displacing the Ta-containing precursor from the process space and terminating the deposition or formation of additional Ta-containing material on the surface of the substrate. Helium is introduced into the process chamber 202 in this embodiment and a low density plasma is initiated using a first radio frequency power in a process space within the process chamber 202. The first radio frequency power may be approximately between 50 watts (W) and 1000 W. In one embodiment, the RF power is approximately between 90 W and 10 W to form a nitrogen-rich TaCN' layer. In another embodiment, the RF power is approximately between 450 W and 550 W to form a carbon-rich TaC'N layer.

The low density plasma is a quasi-neutral gas comprising charged particles, generally electrons and hydrogen ions, and neutral particles which exhibit collective behavior. In one embodiment, Taimata® is adsorbed on the surface of the wafer and the H2 is ionized to react on the surface. As a result, a barrier layer such as TaN or TaCN is formed through reaction with the available hydrogen ions which attack the surface. A thickness of a barrier layer, formed through this atomic layer deposition process is therefore precisely and accurately controlled.

In this embodiment, the plasma is quenched and the helium flow is turned off while purging the chamber with $H_2$ before re-initiating the PEALD process. The process is repeated and a second Ta-containing layer is formed on the first Ta-containing layer. In one embodiment, the first Ta-containing layer is carbon-rich TaC'N layer and the second Ta-containing layer is nitrogen-rich TaCN' layer. The combination of layers may form a barrier film.

Figure 4:
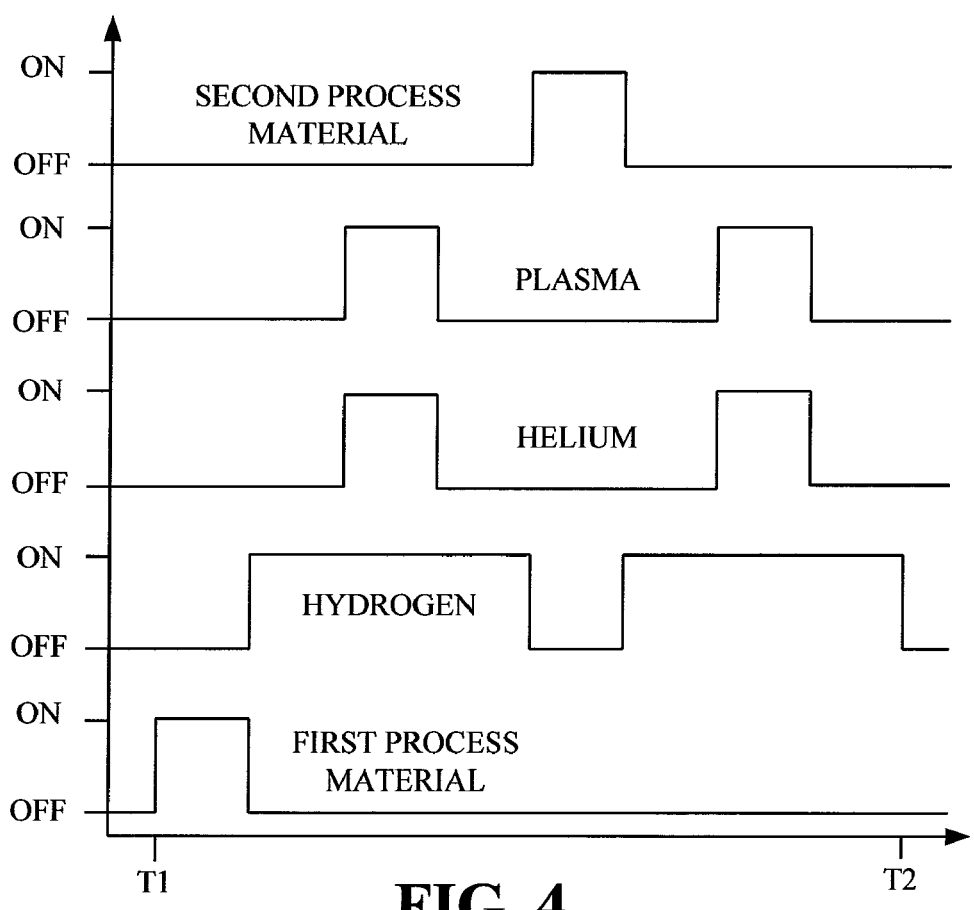
FIG. 4 is an event diagram for a PEALD process for forming a Ta-containing film in accordance with another embodiment of the invention.

FIG. 4 is an event diagram for a PEALD process for forming a Ta-containing film in accordance with another embodiment of the invention. In this embodiment, a first process material is introduced to the process chamber 202 through a first injection plate 282 to expose the substrate 210 to a Ta-containing precursor to adsorb at least a portion of the precursor on a surface of the substrate. The first process material is a Ta-containing precursor, such as those described in FIG. 2, to be adsorbed on the surface of the substrate. In one embodiment, the temperature of the substrate is approximately between 15 Celsius (C) and 250 C. In another embodiment, the temperature of the substrate while the first process material is deposited is approximately between 170 C and 190 C.

In this embodiment, hydrogen ($H_2$) gas is introduced through the first injection plate 282 following the adsorption of the first process material. The introduction of $H_2$ in this embodiment may be used to purge the process chamber 202 of the first process material, thereby displacing the Ta-containing precursor from the process space and terminating the deposition or formation of additional Ta-containing material on the surface of the substrate. Helium is introduced into the process chamber 202 in this embodiment and a low density plasma is initiated using a first radio frequency power in a process space within the process chamber 202. The first radio frequency power may be approximately between 50 W and 100 W. In this embodiment, the composition of the Ta-containing film is established, at least in part, on the type of Ta-containing precursor used. As an example, a Ta-containing precursor comprising a significant amount of carbon may result in a carbon-rich Ta-containing layer. As another example, a Ta-containing precursor comprising a significant amount of nitrogen may result in a nitrogen-rich Ta-containing layer. Ta-containing precursors comprising other species may similarly result in a Ta-containing layer comprising the other species.

Plasma is a quasi-neutral gas comprising charged particles, generally electrons and hydrogen ions, and neutral particles which exhibit collective behavior. The plasma is low density as it comprises hydrogen and helium species. In one embodiment, Taimata® is adsorbed on the surface of the wafer and the $H_2$ is ionized to react on the surface. As a result, a barrier layer such as TaN or TaCN is formed through reaction with available H ions which attack the surface. A thickness of a barrier layer, formed through atomic layer deposition process is therefore precisely and accurately formed as a consequence of the mechanism of forming the layers, namely through an adsorption of the precursor followed by the reaction with hydrogen species.

The plasma is quenched by turning off the radio frequency power. The helium supply is similarly turned-off to allow the flowing hydrogen to form an atmosphere in the process space above the substrate 210 and purge remnants of the precursor and helium.

A second process material is introduced to the process chamber 202 through a first injection plate 282 to expose the substrate 210 to a Ta-containing precursor to adsorb at least a portion of the precursor on a previously formed Ta-containing surface. The second process material is a Ta-containing precursor, such as those described in FIG. 2, to be adsorbed on the surface. In one embodiment, the temperature of the substrate is approximately between 150 Celsius (C) and 250 C. In another embodiment, the temperature of the substrate while the first process material is deposited is approximately between 170 C and 190 C.

Hydrogen gas is introduced through the first injection plate 282 following the adsorption of the second process material. The introduction of $H_2$ in this embodiment may be used to purge the process chamber 202 of the first process material, thereby displacing the Ta-containing precursor from the process space and terminating the deposition or formation of additional Ta-containing material on the surface. Helium is introduced into the process chamber 202 and a low density plasma is initiated using a second radio frequency power in a process space within the process chamber 202. The second radio frequency power may be approximately between 50 W and 1000 W. In this embodiment, the composition of the Ta-containing film is established, at least in part, on the type of Ta-containing precursor used. As an example, a Ta-containing precursor comprising a significant amount of carbon may result in a carbon-rich Ta-containing layer. As another example, a Ta-containing precursor comprising a significant amount of nitrogen may result in a nitrogen-rich Ta-containing layer. Ta-containing precursors comprising other species may similarly result in a Ta-containing layer comprising the other species.

Plasma is a quasi-neutral gas comprising charged particles, generally electrons and hydrogen ions, and neutral particles which exhibit collective behavior. The plasma is low density as it comprises hydrogen and helium species. In one embodiment, Taimata® is adsorbed on the surface of the wafer and the $H_2$ is ionized to react on the surface. As a result, a barrier layer such as TaN or TaCN is formed through reaction with available H ions which attack the surface.

The plasma is quenched by turning off the radio frequency power. The helium supply is similarly turned-off to allow the flowing hydrogen to form an atmosphere in the process space above the substrate 210 and purge remnants of the precursor and helium. The process is repeated and a second Ta-containing layer is formed on the first Ta-containing layer. In one embodiment, the first Ta-containing layer is carbon-rich TaC'N layer and the second Ta-containing layer is nitrogen-rich TaCN' layer. The combination of layers may form a barrier film.

Figure 5:
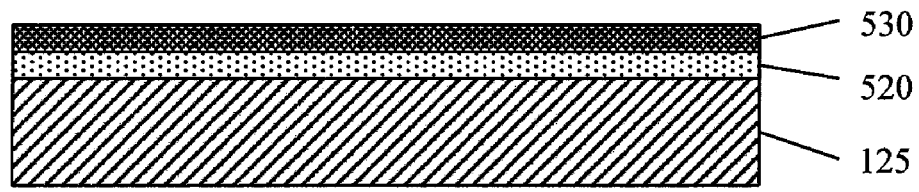
FIG. 5 illustrates a cross-sectional view of a Ta-containing film stack formed on a substrate in accordance with an embodiment of the invention.

FIG. 5 illustrates a cross-sectional view of a Ta-containing film stack formed on a substrate in accordance with an embodiment of the invention. In this figure, two Ta-containing layers are formed as a film on a substrate 210, however the film may be deposited over a complex topography such as a vertical, sloped, or angled geometry with low to very-high aspect ratios, as known to one skilled in the art. Alternatively, a plurality of Ta-containing layers may be formed over a conducting layer such as a Cu layer, a dielectric layer, a low-K dielectric layer, a Cu-seed layer, a doped or un-doped polysilicon layer, a doped or an un-doped silicon layer, though the embodiment is not so limited. A low-K dielectric layer may be formed of a material with a dielectric constant less than the dielectric constant of silicon dioxide, or less than 3.9. The dielectric layer material may be a dense or a porous material containing one or more simple or complex compounds of silicon (Si), oxygen (O), nitrogen (N), carbon (C), hydrogen (H), and/or halogen elements.

The cross-sectional view of FIG. 5 represents only a portion of a substrate with overlying layers, such as a wafer in the context of semiconductor manufacturing. A first Ta-containing layer 520 is formed using a PEALD process, as described in earlier embodiments. The first Ta-containing layer 520 may be tantalum (Ta), tantalum nitride (TaN), tantalum carbide (TaC), tantalum carbon nitride (TaCN), carbon-rich tantalum carbon nitride (TaC'N), nitrogen-rich tantalum carbon nitride (TaCN'), or another Ta-containing layer. The first Ta-containing layer 520 may be approximately 0.2 to 1 nanometer (nm) in thickness. In another embodiment, the first Ta-containing layer 520 may be approximately 0.4 to 0.6 nm in thickness.

A second Ta-containing layer 530 is formed on the first Ta-containing layer 520 as described in earlier embodiments. The second Ta-containing layer 530 may be combined with the first Ta-containing layer to form a multi-layer film such as Ta/TaN, Ta/TaC, Ta/TaC'N, Ta/TaCN', TaC'N/TaCN', TaN/TaC'N, TaN/TaCN', TaC/TaC'N, and TaC/TaCN'. Also, any Ta-containing layer of one type may be formed successively over the same type of Ta-containing layer to form a thicker Ta-containing layer with consistent composition. The type of Ta-containing film used in a film may be dependent on its material properties such as barrier, dielectric, and adhesion properties. Additional layers may be formed over the second Ta-containing layer 530, including additional Ta-containing layers, dielectric layers, low-K dielectric layers, conductive layers, and metal seed layers.

Figure 6:
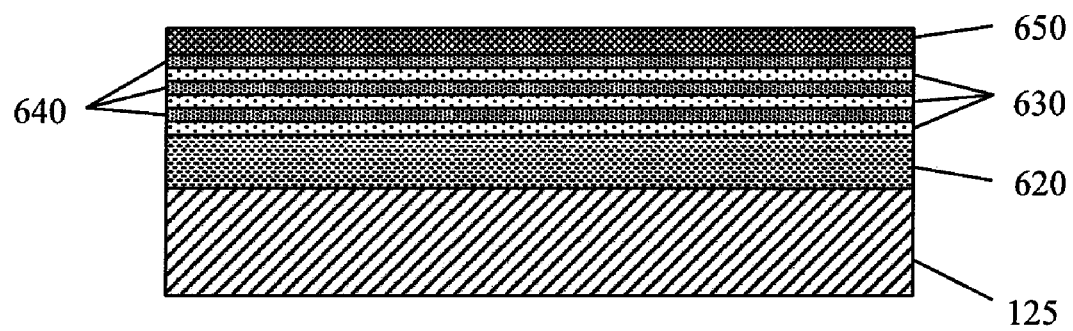
FIG. 6 illustrates a cross-sectional view of a seed material formed on a Ta-containing film stack in accordance with another embodiment of the invention.

FIG. 6 illustrates a cross-sectional view of a copper seed layer formed on a Ta-containing film stack in accordance with another embodiment of the invention. The Ta-containing film stack may form a matrix of material comprising a series of Ta-containing layers over a substrate 125 and a low-K dielectric layer 620. The low-K dielectric layer 620 may be a carbon doped silicon oxide (SiCOH) or another low-K layer known to one skilled in the art. The matrix of material formed on the low-K dielectric layer 620 may be an alternating sequence of Ta-containing layers such as a first Ta-containing layer 630 and a second Ta-containing layer 640, or it may be a plurality of a first Ta-containing layers followed by a plurality of second Ta-containing layers, though the embodiment is not so limited. In this embodiment, a film with good adhesion properties such as Ta, TaC, or TaC'N may be used as a second Ta-containing layer 640.

A matrix of Ta-containing material, or a laminate, may be used to avoid film crystallization of the barrier layer, thereby providing for an amorphous barrier film. The amorphous barrier film may be more effective in minimizing the propagation of contaminants across the barrier film, as opposed to a crystalline film. The total thickness of the amorphous barrier film may be approximately 0.5 to 5 nm. In another embodiment, the total thickness of the amorphous barrier film is approximately 1 to 3 nm.

A seed layer 650 may be formed over the amorphous barrier film in preparation for subsequent processing, such as copper electro-deposition. The seed layer 650 may be used to provide an interface between the top Ta-containing layer and an overlying conductive layer (not shown).

Figure 7:
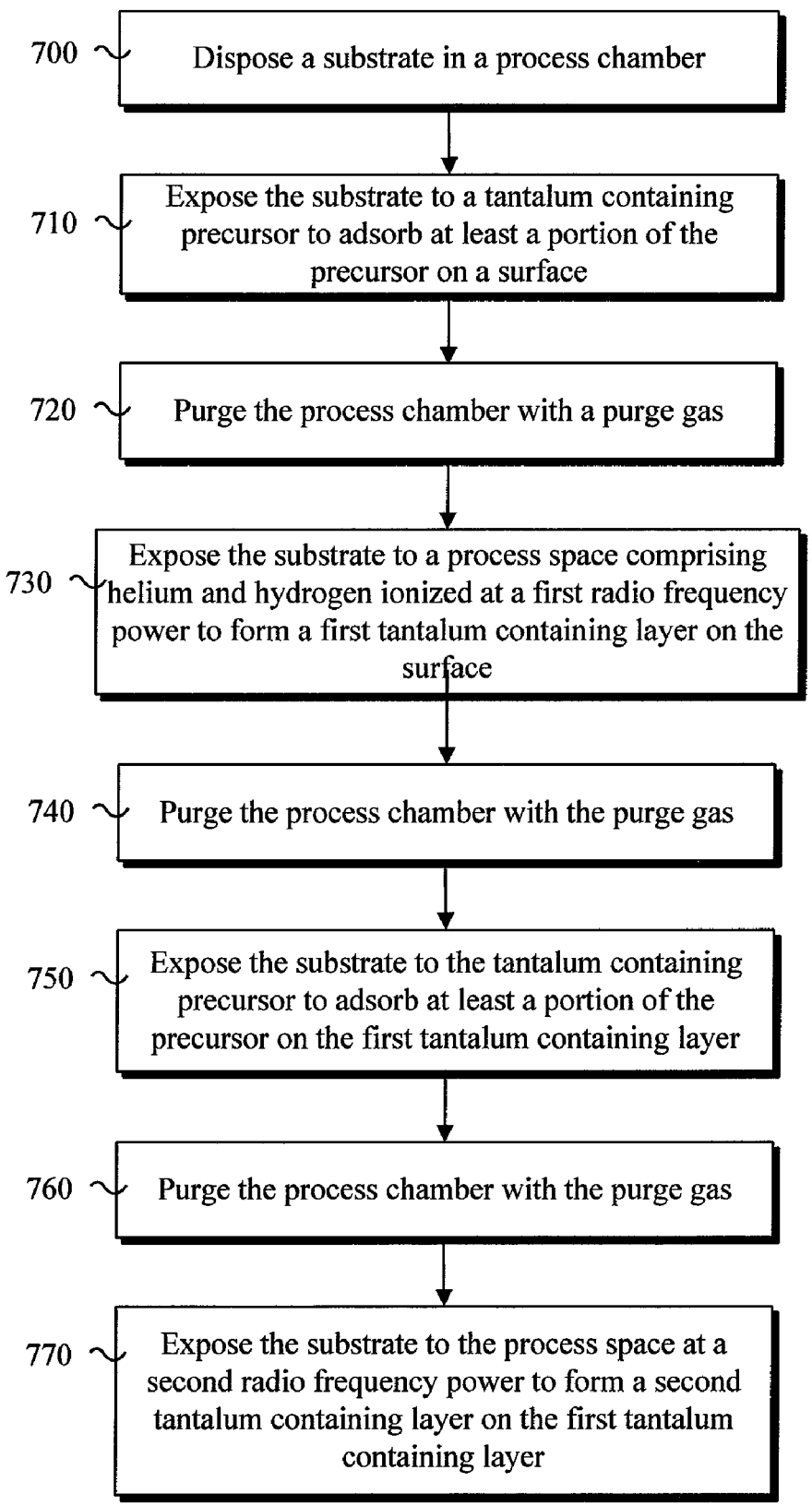
FIG. 7 presents a method of forming a plurality of Ta-containing layers according to an embodiment of the invention.

FIG. 7 presents a method of forming a plurality of Ta-containing layers according to an embodiment of the invention. In element 700, a substrate 125 is disposed in a process chamber 202. The substrate 210 is exposed to a Ta-containing precursor containing a "Ta—N—C" structural unit, such as tertiary amyl imido-tris-dimethylamido tantalum (Ta(NC(CH$_3$)$_2$C$_2$H$_5$)(N(CH$_3$)$_2$)$_3$, hereinafter referred to as Taimata® in element 710 to adsorb at least a portion of the precursor on a surface of the substrate 210. In another example, the Ta-containing precursor can include (pentakis(diethylamido)

tantalum (Ta[N(C$_2$H$_5$)$_2$]$_5$, PDEAT), pentakis(ethylmethylamido) tantalum (Ta[N(C$_2$H$_5$CH$_3$)]$_5$, PEMAT), pentakis(methylamido) tantalum (Ta[N(CH$_3$)$_2$]$_5$, PDMAT), (t-butylimino tris(diethylamino) tantalum (Ta(NC(CH$_3$)$_3$)(N(C$_2$H$_5$)$_2$)$_3$, TBTDET), Ta(NC$_2$H$_5$)(N(C$_2$H$_5$)$_2$)$_3$, Ta(NC(CH$_3$)$_2$C$_2$H$_5$)(N(CH$_3$)$_2$)$_3$, Ta(NC(CH$_3$)$_3$)(N(CH$_3$)$_2$)$_3$, or tert-butyl-tris-ethyl-methylamido tantalum (CH$_3$)$_3$CNTa(NC$_2$H$_5$(CH$_3$))$_3$, TBTEMAT).

In element 720, the process chamber is purged with a purge gas such as a noble gas (i.e., helium, neon, argon, xenon, krypton), or nitrogen (N$_2$), or hydrogen (H$_2$). The substrate is exposed in element 730 to a process space comprising helium and hydrogen ionized at a first RF power to form a first Ta-containing layer on the surface of the substrate 125. The first radio frequency power may be approximately between 50 watts (W) and 1000 W. In one embodiment, the RF power is approximately between 90 W and 110 W to form a nitrogen-rich TaCN layer. In another embodiment, the RF power is approximately between 450 W and 550 W to form a carbon-rich TaCN layer. A RF frequency may, for example, range from approximately 100 kHz to approximately 100 MHz. Alternatively, the RF frequency may, for example, range from approximately 400 kHz to approximately 60 MHz. By way of further example, the RF frequency may, for example, be approximately 27.12 MHz or 13.56 MHz.

The process chamber is purged with the purge gas in element 740 and the substrate is exposed to the Ta-containing precursor to adsorb at least a potion of the precursor on the first Ta-containing layer in element 750. In element 760, the process chamber is purged with the purge gas to displace the first Ta-containing precursor from the process space above the substrate 125. The substrate 125 is exposed to the process space comprising a second RF power in element 770 to form a second Ta-containing layer on the first tantalum containing layer. The second RF power may be approximately between 50 W and 1000 W. In one embodiment, the RF power is approximately between 90 W and 110 W to form a nitrogen-rich TaCN' layer. In another embodiment, the RF power is approximately between 450 W and 550 W to form a carbon-rich TaC'N layer. Elements 710 through 770 of FIG. 7 may be repeated one or more times to achieve a desired film thickness based on the plurality of tantalum containing layers.

Figure 8:
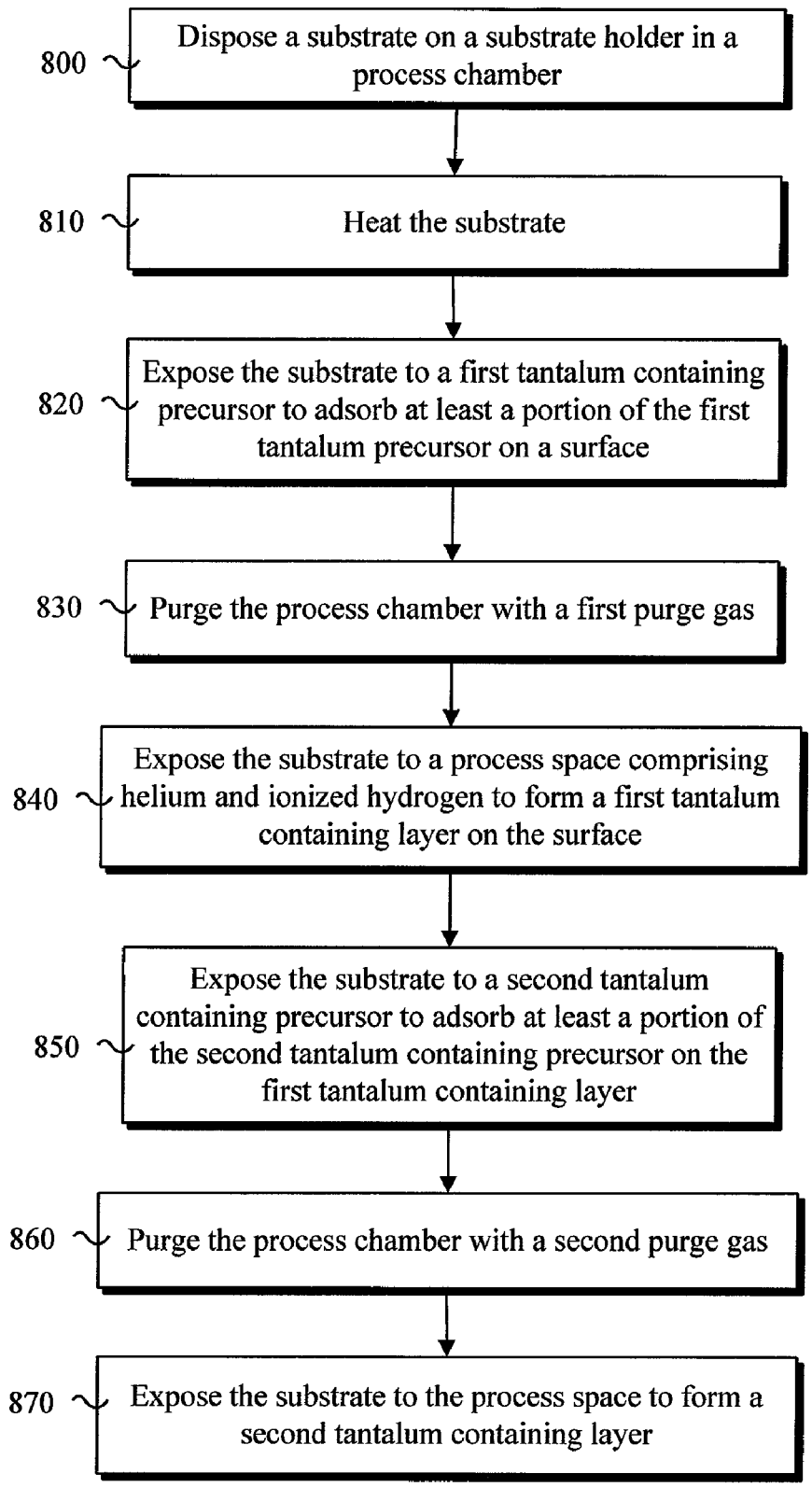
FIG. 8 presents a method of forming a plurality of Ta-containing layers according to another embodiment of the invention.

FIG. 8 presents a method of forming a plurality of Ta-containing layers according to another embodiment of the invention. In element 800, a substrate 125 is disposed on a substrate holder in a process chamber 110. The substrate is heated in element 810 by a heater embedded in the substrate holder, a radiation heater such as a lamp heater, or other heating device in a range of approximately 120 C and 400 C in one embodiment. The substrate is heated in a range of approximately 150 C to 250 C in another embodiment. The substrate 125 is exposed to a first Ta-containing precursor containing a "Ta—N—C" structural unit, such as tertiary amyl imido-tris-dimethylamido tantalum (Ta(NC(CH$_3$)$_2$C$_2$H$_5$)(N(CH$_3$)$_2$)$_3$, referred to as Taimata® in element 820 to adsorb at least a portion of the precursor on a surface of the substrate 125.

In element 830, the process chamber is purged with a first purge gas such as a noble gas (i.e., helium, neon, argon, xenon, krypton), or nitrogen (N$_2$), or hydrogen (H$_2$). The substrate is exposed in element 840 to an ionized process space comprising helium and hydrogen to form a first Ta-containing layer on the surface of the substrate 125.

The process chamber may be purged with the purge gas and the substrate is exposed to a second Ta-containing precursor to adsorb at least a potion of the second Ta-containing precursor on the first Ta-containing layer in element 850. In element 860, the process chamber is purged with a second purge gas to displace the first Ta-containing precursor from the process space. The first purge gas and the second purge gas may be the same gas or they may be different gases or gas mixtures. The substrate 125 is exposed to the process space to form a second Ta-containing layer in element 870. Elements 820 through 870 of FIG. 8 may be repeated one or more times to achieve a desired film thickness based on the plurality of tantalum containing layers.

A plurality of embodiments for forming a plurality of Ta-containing layers using plasma enhanced atomic layer deposition has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or upper layer is the "top" surface of that substrate; the substrate may actually be in any orientation so that a "top" side of a substrate may be lower than the "bottom" side in a standard terrestrial frame of reference and still fall within the meaning of the term "top."

The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a multi-layer film, comprising:
    disposing a substrate in a process chamber;
    heating the substrate;
    exposing the substrate to a tantalum containing precursor to adsorb at least a portion of the tantalum containing precursor on a surface of the substrate;
    purging the process chamber with a purge gas;

exposing the substrate to a process space comprising helium and hydrogen ionized at a first radio frequency power to form a first tantalum containing layer on the surface;

exposing the substrate to the tantalum containing precursor to adsorb at least a portion of the precursor on the first tantalum containing layer;

purging the process chamber with the purge gas; and exposing the substrate to the process space at a second radio frequency power to form a second tantalum containing layer, wherein the first tantalum containing film has a higher nitrogen-content than the second tantalum containing film, wherein the second radio frequency power is greater than the first radio frequency power, and wherein the Ta-containing precursor is selected from the group consisting of TAIMATA, PDEAT, PEMAT, PDMAT, TBTEMAT, $Ta(NC_2C_2H_5)(N(C_2H_5)_2)_3$, $Ta(NC(CH_3)_2C_2H_5)(N(CH_3)_2)_3$, and $Ta(NC(CH_3)_3)(N(CH_3)_2)_3$.

2. The method of claim 1, wherein the first and second tantalum containing layers are barrier layers.

3. The method of claim 1, further comprising forming a plurality of multi-layer films on the surface.

4. The method of claim 1, wherein the purging comprises flowing the purge gas through the process chamber, wherein the purge gas comprises a noble gas, $N_2$, or $H_2$, or a combination of two or more thereof.

5. The method of claim 3, further including forming a seed layer on the plurality of multi-layer films.

* * * * *